United States Patent [19]

Chu et al.

[11] 3,993,123

[45] Nov. 23, 1976

[54] GAS ENCAPSULATED COOLING MODULE

[75] Inventors: Richard C. Chu; Omkarnath R. Gupta; Un-Pah Hwang; Robert E. Simons, all of Poughkeepsie, N.Y.

[73] Assignee: International Business Machines Corporation, Armonk, N.Y.

[22] Filed: Oct. 28, 1975

[21] Appl. No.: 626,399

[52] U.S. Cl. .............................. 165/80; 317/100; 357/82; 165/104 R
[51] Int. Cl.² .................................. H01L 23/44
[58] Field of Search ............... 165/80, 105; 357/82; 317/100

[56] References Cited
UNITED STATES PATENTS
3,741,292  6/1973  Kumar .................. 357/82

*Primary Examiner*—Alan Cohan
*Attorney, Agent, or Firm*—Harold H. Sweeney, Jr.

[57] ABSTRACT

A gas encapsulated cooling unit is provided for one or more heat generating components mounted on a substrate. A heat conductive cap is sealed to the substrate enclosing the heat generating components. The wall of the cap opposite the substrate contains elongated openings therein extending towards the heat generating components and on the same centers with respect thereto. A resilient member is located in the cap in communion with the inner end of the openings. A thermal conductive element is located in each of the openings forming a small peripheral gap between each opening wall and the associated thermal conductive element. The resilient member urges the thermal conductive elements into pressure contact with the heat generating components. A thermal conductive inert gas is located within the cap filling the peripheral gaps and the interfaces between the heat generating elements and the thermal conductive elements. The heat is removed from the cap by external heat removal means.

10 Claims, 9 Drawing Figures

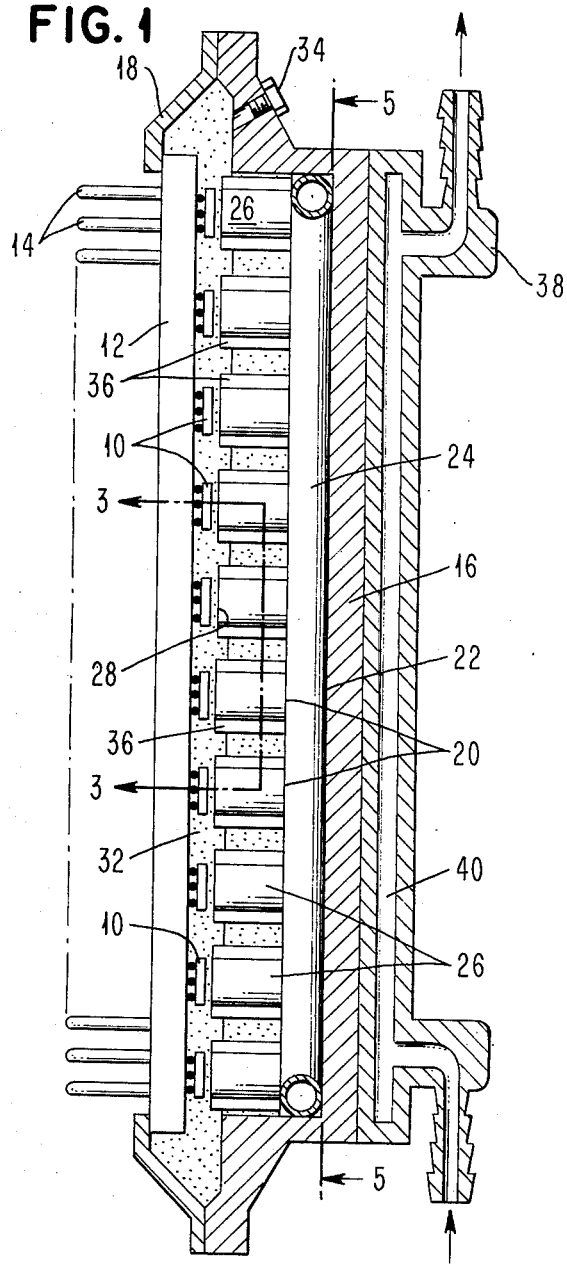
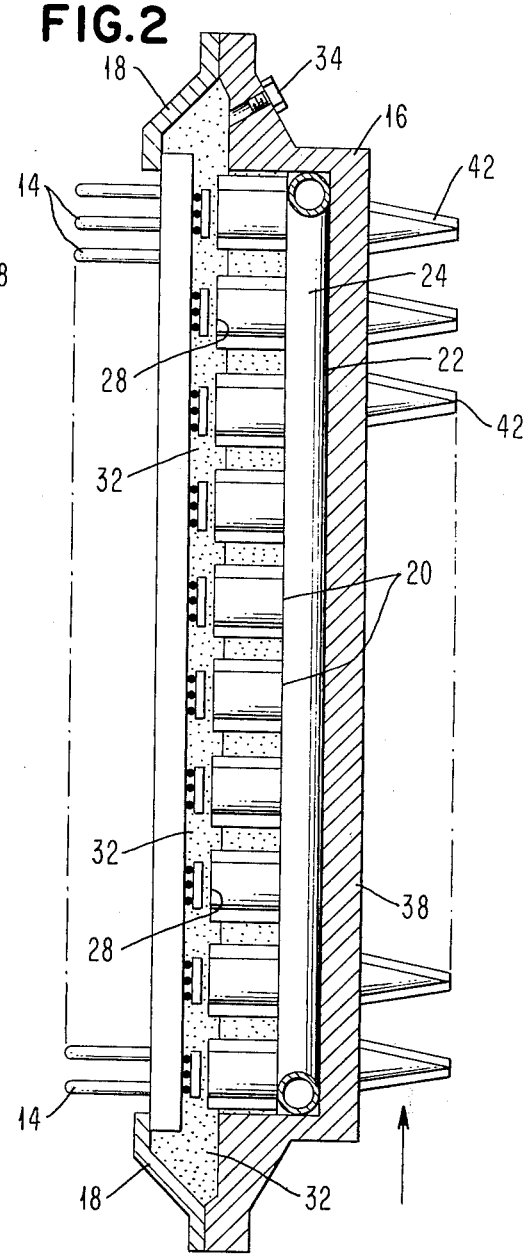
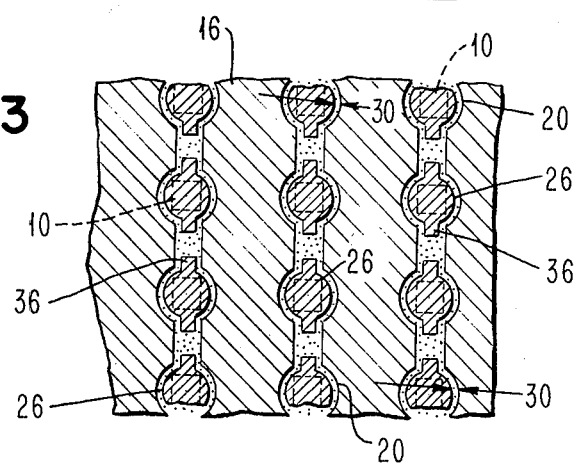

GAS ENCAPSULATED COOLING MODULE

STATEMENT OF THE INVENTION

This invention relates to conduction cooling of small heat generating electronic devices and, more particularly, to the cooling by conduction of miniaturized electronic devices in an encapsulated, inert, high thermal conductivity gaseous atmosphere.

BACKGROUND OF THE INVENTION

With the miniaturized capabilities afforded by the discovery of solid state electronics, various improved means of dissipating the heat generated by solid state components have been investigated. The standard forced air convection means appears to have reached its's limit of practicality in that the amount of air that is required to provide sufficient cooling for the limited heat dissipating surfaces introduces a noise problem, and without some auxiliary techniques cannot maintain each of a large number of components within it's critical, narrow operating temperature range. Accordingly, especially in connection with large scale computer systems, various combinations of air-liquid cooling systems have been devised. One of the more recent systems investigated has been the immersion cooling system, wherein the array of components to be cooled is immersed in a tank of cooling liquid. The liquids used are the new fluorocarbon liquids which have a low-boiling point. These liquids are dielectric and give rise to various types of boiling at relatively low temperatures. In view of the problems encountered in servicing and packaging components which are cooled using this immersion technique, an encapsulated cooling technique was devised which includes the same dielectric material encapsulated separately for each module. U.S. Pat. No. 3,741,292, issued June 26, 1973 shows an example of a module having the heat generating components located thereon surrounded by a low boiling point dielectric liquid which is encapsulated thereto. A vapor space is located above the liquid level, which is filled with internal fins extending into the container serving as a condenser for the dielectric liquid vapors. External fins extend outward from the container and serve as an air cooled sink for the internal fins condenser. However, this type of a modular liquid encapsulated cooling device must meet certain inflexible requirements. For instance, it requires coolant of extremely high purity and free of any contaminants. It's operation is sensitive to all the variables which govern the basic process of nucleate boiling and vapor condensation. Furthermore, the concept is not readily adaptable to small scale applications such as a single heat generating component.

Accordingly, it is the main object of the present invention to provide an encapsulated cooling unit which utilizes inert gas having good thermal conductivity as the encapsulated medium in combination with a conductive heat transfer arrangement.

It is another object of the present invention to provide encapsulated inert gas having good thermal conductivity and having a low molecular weight so that it fills the heat transfer interfaces thereby providing a low thermal resistance path.

It is a further object of the present invention to provide an encapsulated inert gas with good thermal conductivity and a heat conducting element combination for cooling, in which the element is urged against the heat generating component to decrease the thermal resistance of the interface.

It is a further object of the present invention to provide an encapsulated inert gas having good thermal conductivity and a heat conductive element combination in which the heat transfer is automatically regulated as a function of temperature.

SUMMARY OF THE INVENTION

An encapsulated cooling unit is provided for one or more heat generating devices to be cooled which are mounted on a substrate. A cap is sealed to the substrate enclosing the heat generating devices to be cooled. An inert gas and good thermal conductive elements are contained within the sealed volume between the cap and the substrate. Each of the heat conductive elements are urged against respective ones of the heat generating devices forming a smallest gas gap to provide lowest thermal resistance. A heat sink associated with the cap receives the heat from the heat conductive elements through an annular gap which likewise contains the inert gas.

The foregoing and other objects, features and advantages of the invention will be apparent from the following more particular description of a preferred embodiment of the invention, as illustrated in the accompanying drawings.

BRIEF DESCRIPTION OF THE DRAWINGS

FIG. 1 is a vertical cross-sectional side view of a module showing the elements within the sealed volume between the cap and the substrate.

FIG. 2 is a vertical cross-sectional side view of a module showing fins extending therefrom suitable for air cooling.

FIG. 3 is a cross-sectional view taken along the line 3—3 in FIG. 1.

DESCRIPTION OF PREFERRED EMBODIMENT

Referring to FIG. 1 there is shown a cross-sectional view of a gas encapsulated module for providing cooling of the solid state electronic chips 10 to be cooled. As is well known, the chip consists of solid state circuits and devices which are densely packed on each chip. The power consumed in the circuits within the chip generates heat which must be removed from the chip. Since the various circuits have different power requirements, and since the integrated components thereon must be maintained within certain temperature ranges for reliable operation, the cooling must be of such character as to maintain the chip temperature within the required operating range.

Figure 4:
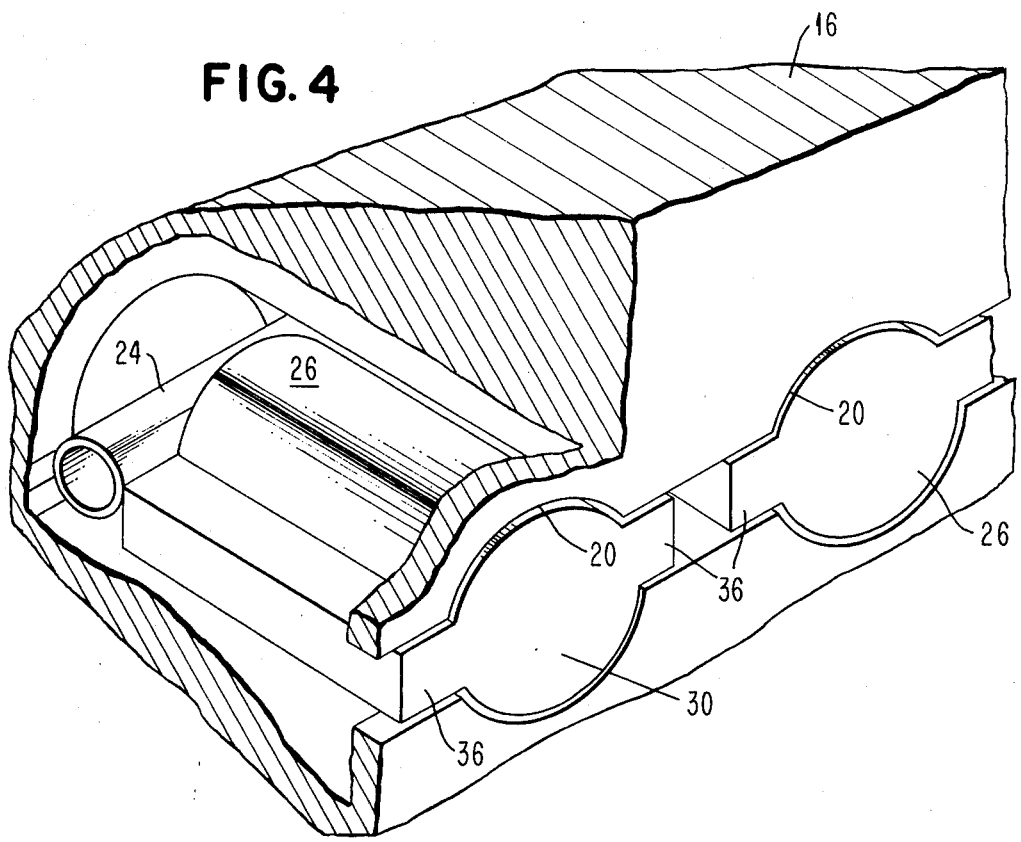
FIG. 4 is an expanded perspective view of part of the inside of the cap showing the tubular member pressure actuator and one of the conductive elements.

The chips 10 are mounted on one side of a substrate 12, generally made of ceramic, which has pins 14 extending from the other side thereof. These connecting pins 14 provide for the plugging of the module into a board (not shown) which may very well carry auxiliary circuits etc. A container or cap 16 is attached to the substrate 12 by means of a flange 18 which extends from the periphery of the substrate 12 to the cap 16. The cap 16 is made of a good heat conductive material such as copper or aluminum. The cap 16 is sufficiently thick to provide openings 20 therein and a channel 22 therethrough associated with each of the closely spaced openings. The cap 16 instead of being thick can have extensions therefrom which extend toward the chip 10 and which has an opening or hole 20 in each extension. The channel 22 in the cap 16 extends over the openings 20 therein such that a resilient tube 24 mounted in the channel 22 passes over the end of each of the openings 20. The tubular member 24 which serves as a pressure actuator is inserted into the channel 22 in the cap 16 from the outer side before the conductive elements 26 are inserted into their holes 20, as can be seen in FIG. 4. This resilient tubular member 24 includes a binary fluid mixture of fluorocarbons which changes phase at a present temperature, controlled by the mixing ratio. The expanding fluid causes the resilient tubular member 24 to expand as a function of temperature. The openings or holes 20 within the cap member 16 are accurately sized to receive a thermal conductive element 26, one end of which abuts the tubular member 24 and the other end of which abuts the face of the chip 10 forming an interface 28 therebetween. As can be seen in FIGS. 3 and 4, element 26 is dimensioned such that a small annular gap 30 exists between it's circumference and the side walls of the hole 20 in the cap 16. The gap 30 is sufficiently wide to allow a little play of the element 26 within the hole 20 so that the element 26 can attain relatively flat surface engagement with the chip 10. It should also be appreciated that the thermal conductive element 26 is adaptable to chips 10 of various heights because of the pressure actuator tubular member resiliency. Helium gas 32 is introduced into the open space between the substrate and the cap 16 through the gas fill opening 34 shown at the top of FIG. 1. Helium gas is utilized for several reasons. The gas has a low molecular weight and thus easily fills the voids in the interface 28 between the thermal conductive elements 26 and the chips 10. Likewise, the helium gas 32 fills the gap 30 between the periphery of the thermal conductive element 26 and the wall of the hole 20 thus forming a gaseous thermal conductive interface. Another feature of the gas is that it is a good thermal conductor and, therefore, forms an interface having high heat conductivity. That is, the interfaces formed using helium gas have a relatively low thermal resistance. Another feature of the gas which is very important is that it is inert. By inert is meant that the gas is electrically non-conductive, non-poisonous, non-corrosive, non-flammable, non-explosive and non-toxic. The gas also has a high adhesion quality that essentially wets the surface which it is in contact with. Other low-molecular weight gases such as hydrogen or carbon dioxide could be used. However, these gases appear to have undesired properties such as the explosive nature of hydrogen. As can be seen from FIG. 3, the thermal conductive elements 26 have a flange like extension 36 at opposite sides thereof but are otherwise cylindrical in shape. The flange extensions 36 were included to obtain more surface area on the thermal conductive element 26 to provide a greater thermal transfer therefrom. These flanges also serve as keys to properly orient the thermal conductive elements 26 within the holes 20. The interface 28 between the thermal conductive element 26 and the chip 10 is actually a pressure interface since the thermal conductive elements 26 are urged against the chips 10 by the resilient tubular member 24 pressing on the other end thereof. FIGS. 1, 2, 6 and 8 show the interface 28 as a small gap for purposes of illustration. Thus, this pressure interface 28 containing a thermal conductive inert gas in the voids provides a low resistance to the heat transfer and, accordingly, provides a high heat conductive interface. The gap 30 around the periphery of the thermal conductive element 26 and it's extensions or flanges 36, as previously mentioned, forms a wider gap with the surrounding walls of the cap 16. Since the gap 30 is wider, even though it is filled with the high thermal conductive helium gas 32, it has a higher thermal resistance than is encountered with the interface 28 between the chip and the thermal conductive element 26. Accordingly, more surface area of the conductive element 26 is required to transfer the same amount of heat across the higher thermal resistance gap 30 than is required to transfer the equal amount of heat across the lower thermal resistance gap at the pressure interface 28. Thus, the module must be designed to obtain the required heat transfer rate to maintain the chip 10 within it's required operating range. The heat accumulated in the good thermal conductive material cap 16 from each of the thermal conductive elements 26 is transferred to a coldplate 38 which is attached to the cap 16. As can be seen FIG. 1, the cap 16 surface is relatively flat so that the coldplate 38 can be attached thereto in good thermal conductive relation. The cap 16 can also serve as the wall of the coldplate. The coldplate 38 has a cooling liquid 40 circulated therethrough which removes the heat transferred to the coldplate.

The module is not limited to the coldplate type of exterior heat removal. As shown in FIG. 2, the outer surface of the cap 16 has fins 42 arranged thereon such that air can be forced thereacross to remove the heat.

Figure 8:
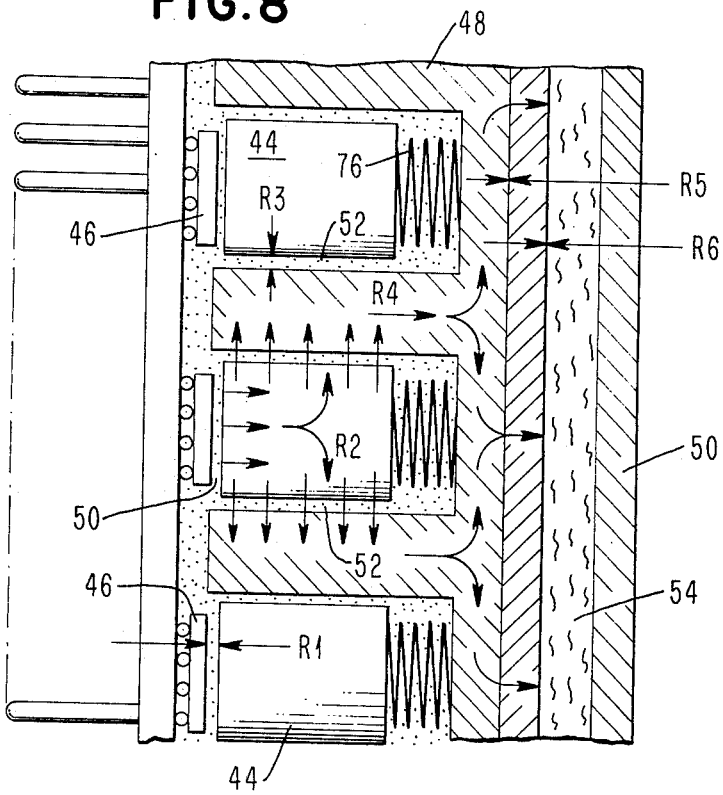
FIG. 8 is an expanded cross-sectional view of a part of a module showing an individual pressure actuator for each thermal conductor and showing the various thermal resistances in the thermal path.

FIG. 8 shows expanded heat path portion of a gas encapsulated cooling module having cylindrical thermal conductive elements 44. The various gaps and paths the heat passes through in order to be removed by the external heat removal means is also shown. The heat from the chip 46 must overcome the resistance R1 of the gap or inerface 50 between the chip 46 and the thermal conductive element 44. The thermal conductive element 44 is made of copper or other good heat conducting materials which results in lower thermal resistance R2. The gap 52, as mentioned previously, has helium therein and the thermal resistance R3 must be overcome. The thermal resistance R4 is calcuated for the material of the cap 48. Thermal resistance R5 represents the resistance of the interface between the cap 48 and the coldplate 50, and the thermal resistance R6 represents the resistance from the coldplate 50 to the liquid 54. The thermal resistance R1 with the helium located in the interface 50 is approximately five times less than the thermal resistance using air in the interface.

FIG. 4 is an expanded perspective view showing the pressure actuator tubular member 24 and one of the thermal conductive elements 26 in place within the channel 22 and hole 20 in the cap 16, respectively.

Figure 5:
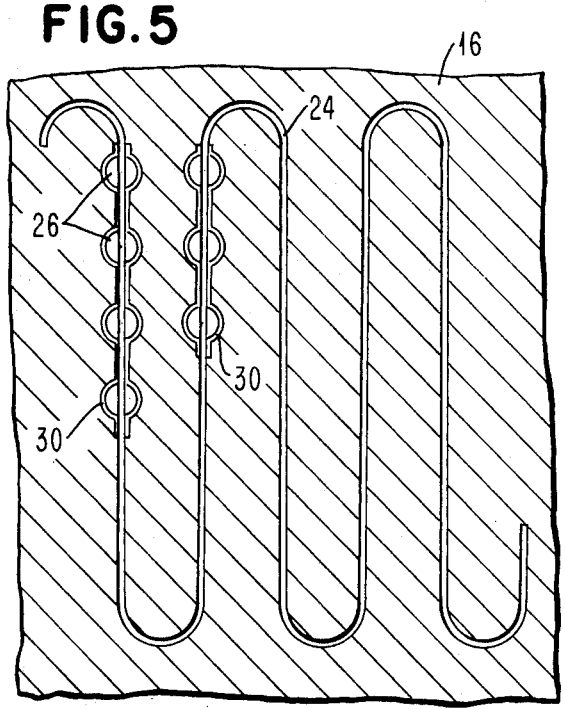
FIG. 5 is a view taken along line 5—5 of FIG. 1 showing the serpentine configuration of the thermal pressure actuator.

FIG. 5 shows a view taken along 5—5 of FIG. 1 showing the serpentine arrangement of the resilient tubular member 24 covering each of the back ends of the conductive elements 26 to urge them against their respective chips. It should be appreciated that as the overall heat generated by the chips rises, the temperature of the helium gas surrounding the tubular member rises causing the resilient tubular member 24 which, as previously mentioned, contains a binary mixture of flurocarbon liquids, to rise in temperature and expand. Thus, the level of pressure exerted on the thermal conductive elements 26 will be self-regulated as a function of temperature, of course, it will be limited by the maximum temperature.

It should be noted that the operation of the module is independent of it's orientation. It also works in low gravity or zero gravity environments such as in space or on the lunar surface.

Figure 6:
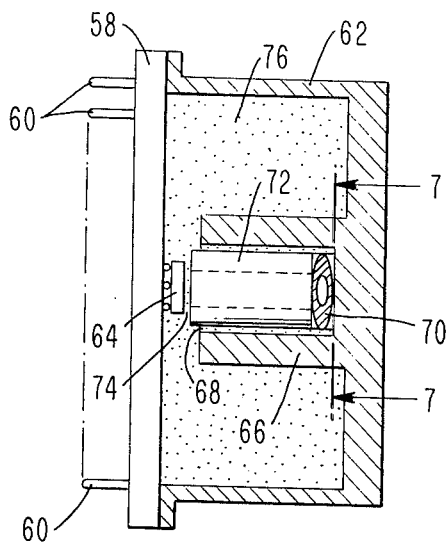
FIG. 6 is a cross-sectional side view showing a module containing encapsulated gas and a single thermal conductor arrangement for cooling a single chip.
Figure 7:
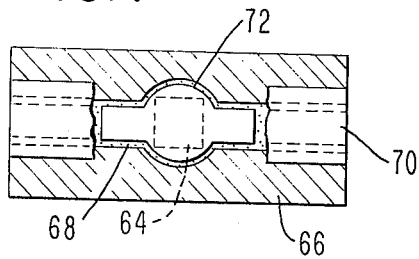
FIG. 7 is a view looking along the line 7—7 of FIG. 6 showing the individual thermal pressure actuator.

A single chip, helium encapsulated, conductive cooling unit is shown in FIGS. 6 and 7. The chip is shown mounted on a substrate 58 which has the pins 60 extending from the opposite side thereof for plugging the unit onto a board. A cap or container 62 is sealed to the substrate enclosing the chip 64. The cap 62 has a central extension 66 which extends from the top of the capy into the encapsulated area. The extension 66 has a hole therein which extends from the end of the extension nearest the chip 64 to the wall of the cap 62. A resilient member 70 is located at the bottom of the hole or opening 68 abutting the wall of the cap 62. A thermal conductive element 72 is fitted into the hole 68 and pressed against the resilient member 70. It will be appreciated that the element 72, when in place in the opening 58 in the cental extension 66 of the cap 62, abuts the chip 64 forming an interface 74 therewith. The remaining open areas within the cap 62 are evacuated and a helium gas 76 is placed therein under a small positive pressure to prevent leakage of the ambient atmosphere into the cap interior. This small positive pressure within the unit can be maintained by including a helium capsule (not shown) within the cap which has a predetermined small leakage rate. This gas 76, being of a low molecular weight, seeps into the interface 74 between the thermal conductive element 72 and the chip 64, and also seeps into the gap between the periphery of the element 72 and the inside wall of the hole 68 in the central extension 66 of the cap 62. The thermal pressure actuator 70 if formed by an expandable element, like a bellows, which includes therein a binary fluid mixture of fluorocarbon liquids which engages changes phase at a predetermined temperature, controlled by the mixing ratio. Thus, as the heat generated by the chip 64 increases, the binary fluid mixture temperature within the tubular member pressure actuator 70 will rise causing expansion of the associated thermal pressure actuator and, thus, applying increased pressure on the thermal conductive element 72. This increased pressure on the element 72 will make a tighter interface 74 between the chip 64 and the element 72. As the pressure increases at this interface 74, the thermal resistance goes down, thereby increasing the heat removal from the chip 64. This thermal regulation tends to keep the chip within it's operating range. The size and shape of the thermal pressure actuactor 70 along with it's orientation with respect to the thermal conductive element 72 can best be seen in FIG. 7 which is a view taken along the line 7—7 of FIG. 6. If the module cap 62 surfaces do not prove sufficient for removing the heat generating by the single chip, fins or a small coldplate can be easily attached thereto. It should be noted, that the resilient thermal pressure actuator 70 located behind the element 72 allows the element to easily adapt to the height of the chip 64. It should also be noted that the resilient thermal pressure actuator 70 in conjunction with the peripheral gap 68 allows the thermal conductive element 72 to adapt to the chip surface 74.

FIG. 8, in addition to showing the thermal path from the chip 46 to the fluid 54 of the coldplate 50, shows a section of a helium encapsulated conductive cooling unit having a mechanical or pneumatic thermal actuator 76. The mechanical actuator 76, as shown, can be a coil type spring which continually exerts pressure against the thermal conductor element 44 forming a continual pressure interface 50 between the element 44 and the chip 46. This particular spring loaded thermal conductive element arrangement is not self-regulating as was the unit containing the expandable resilient member containing a gas which expands with temperature. The space behind the thermal conductive element 44 could be filled with a resilient material such as a foam, instead of a spring, which would tend to apply a minimal pressure to the thermal conductive element and just hold it more or less in position against the chip. Such a low pressure interface would affect the thermal resistance of the interface somewhat, but not enough to make such an arrangement unusable in most cases. Of course, a pneumatic thermal actuator rather than a mechanical arrangement could also be utilized. The pneumatic thermal actuator could be made self-regulating.

Figure 9:
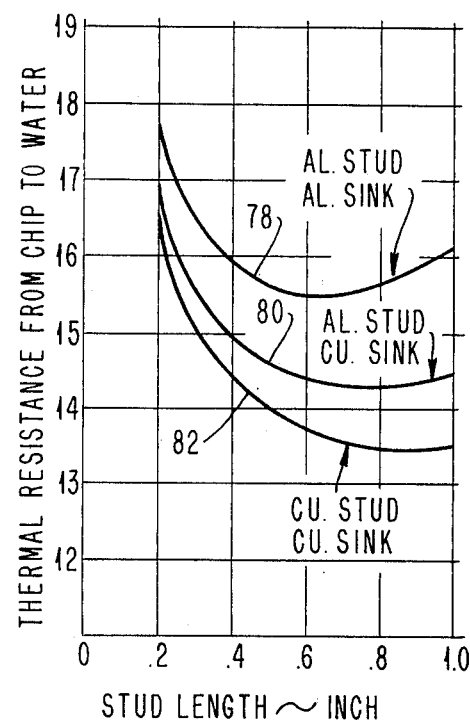
FIG. 9 is a plot of the thermal resistance from the chip to the cooling water of the external heat removal means versus the thermal conductive stud length for various materials.

FIG. 9 is a graph wherein the thermal resistance from the chip 46 to the water 54 of the coldplate 50 in degrees centigrade per watt is plotted against the thermal conductive element length in inches for both aluminum and copper elements 44 and aluminum and copper heat sinks as shown in FIG. 8. The heat sink includes the thermal path through the cap and the abutting wall of the coldplate. All of the plots on the graph were made using 0.180 inch square chips, elements on 0.254 inch centers and holes in which the stud is located having 0.260 inch centers. The interface between the chip and the conductive element was maintained at 0.0005 inches. The top plot or curve 78 was generated using an aluminum conductive element and an aluminum sink. It can be observed that the thermal resistance from the chip to the water in the coldplate tends to drop off from a high of 18° centigrade per watt for a o.2 inch long stud to a lowest resistance of approximately 15.6° centigrade per watt at an element length of 0.6 inches. For element lengths longer than 0.6 inches the thermal resistance appears to increase slightly. Accordingly, the optimum thermal conductive element length for the particular chip, element and hole size selected appears to be 0.6 inches. The middle curve 80 was obtained using an aluminum thermal conductive element and a copper heat sink. It will be appreciated that the thermal resistance is generally lower indicating that the copper is a better heat conductor than the aluminum. As would be expected, the third curve 82 provides an overall lower thermal resistance using a copper element and a copper heat sink. It should also be noted in the bottom curve that the lowest thermal resistance was obtained using a thermal conductive element 0.9 inches in length.

The high heat conductivity of helium and the ability of helium to fill gaps and interfaces, thereby providing a low thermal resistance junction, have been utilized to provide a cooling unit for solid state electronic chips which must be kept within a specific thermal operating range. Also the inertness of the helium gas makes it highly suitable for use in a cooling arrangement as set forth above.

While the invention has been particularly shown and described with reference to a preferred embodiment thereof, it will be understood by those skilled in the art that the foregoing and other changes in form and detail may be made therein without departing from the spirit and scope of the invention.

What is claimed is:

1. A gas encapsulated cooling module for heat generating elements comprising:
   a substrate;
   one or more heat generating components mounted on said substrate;
   a heat conductive cap sealed to said substrate enclosing said one or more heat generating components;
   the wall of said cap opposite the substrate containing elongated openings therein extending toward said heat generating components and on the same centers with respect thereto,
   a resilient member located in said cap in communion with the inner end of said openings;
   one or more thermal conductive elements each located in one of said openings forming a small peripheral gap between the opening wall and said associated thermal conductive element, said resilient member urging said thermal conductive element into contact with one of said heat generating components forming a heat transfer interface therewith;
   a thermal conductive inert gas located within said cap filling the peripheral gaps and said heat generating element conductive element interface;
   heat removal means associate with said cap for externally removing the heat generated by said heat generating means from said cap.

2. A gas encapsulated cooling module according to claim 1, wherein said one or more heat generating devices are electronic chips and said thermal conductive inert gas is helium.

3. A gas encapsulated cooling module according to claim 1, wherein said cap is made of a good thermal conductive material for acting as a good thermal path for the heat flow thereto by conduction through said gas in said peripheral gap from said thermal conductive elements and by convection via said gas from said heat generating devices.

4. A gas encapsulated cooling module according to claim 2, wherein said helium gas pressure is obtained from a helium capsule having a given rate of gas leakage located within said cap to provide a continuous positive pressure within said cap preventing the entrance of ambient air.

5. A gas encapsulated cooling module according to claim 1, wherein said heat removal means is a coldplate having a wall of said cap forming a wall of said coldplate, said wall having an inward extension of high thermal conductivity material surrounding the peripheral surface of said heat conductive elements forming said small peripheral gap over the entire peripheral area thereof which contains said gas to give a good heat transfer path to said heat removal means.

6. A gas encapsulated cooling module according to claim 1, wherein said heat removal means comprises a plurality of cooling fins extending from the outer wall of said cap, said wall having an inward extension of high thermal conductivity material surrounding the side surfaces of said heat conductive elements forming a gap therebetween containing said gas to give a good heat transfer path from said heat conductive elements to said cap, and cooling fins extending therefrom which are adapted for heat removal by forced air.

7. A gas encapsulated cooling module according to claim 1, wherein said resilient member comprises a plurality of springs, one compressed between each of said heat conductive elements and said cap to maintain said conductive elements pressed against respective heat generating devices to form good heat conductive gas filled interfaces therebetween.

8. A gas encapsulated cooling module according to claim 1, wherein said resilient member is variable as a function of temperature to provide self-regulation of the pressure exerted by said resilient member.

9. A gas encapsulated cooling module according to claim 8, wherein said resilient member comprises an expandable member containing a binary mixture of fluorocarbon liquids which changes phase at a predetermined temperature controlled by the mixing ratio to provide self-regulation of interface pressure in accordance with temperature.

10. A gas encapsulated cooling module according to claim 9, wherein said expandable member is an elastic tube located in a channel and arranged in a continuous manner to be across the top end of each of said heat conductive elements so as to impart pressure through expansion to said heat conductive elements as the temperature of the fluorocarbon liquid rises in response to an accumulative increase in heat generating device temperature.

* * * * *